United States Patent
Lee et al.

(10) Patent No.: US 9,999,907 B2
(45) Date of Patent: Jun. 19, 2018

(54) CLEANING PROCESS THAT PRECIPITATES YTTRIUM OXY-FLOURIDE

(71) Applicant: Applied Materials, Inc., Santa Clara, CA (US)

(72) Inventors: Chengtsin Lee, Union City, CA (US); Jennifer Y. Sun, Mountain View, CA (US); Yikai Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 15/089,212

(22) Filed: Apr. 1, 2016

(65) Prior Publication Data

US 2017/0282221 A1    Oct. 5, 2017

(51) Int. Cl.
| | | |
|---|---|---|
| C23G 1/02 | (2006.01) | |
| B08B 3/12 | (2006.01) | |
| H01J 37/32 | (2006.01) | |
| C11D 11/00 | (2006.01) | |

(52) U.S. Cl.
CPC ............ B08B 3/12 (2013.01); C11D 11/0023 (2013.01); H01J 37/32009 (2013.01); H01J 37/32862 (2013.01); H01J 2237/334 (2013.01); H01J 2237/335 (2013.01)

(58) Field of Classification Search
None
See application file for complete search history.

(56) References Cited

U.S. PATENT DOCUMENTS

| | | | |
|---|---|---|---|
| 5,567,244 A | 10/1996 | Lee et al. | |
| 5,972,123 A | 10/1999 | Verhaverbeke | |
| 6,607,605 B2 | 8/2003 | Tan | |
| 6,810,887 B2 | 11/2004 | Tan | |
| 7,624,742 B1 | 12/2009 | Zuck | |
| 7,789,969 B2 | 9/2010 | Rabinovich et al. | |
| 7,964,085 B1 | 6/2011 | Wang et al. | |
| 8,067,067 B2 | 11/2011 | Sun et al. | |
| 8,173,228 B2 | 5/2012 | Choi et al. | |
| 8,231,736 B2 | 7/2012 | Sun et al. | |
| 8,492,674 B2 | 7/2013 | Wang et al. | |
| 8,714,166 B2 | 5/2014 | Sommers et al. | |

(Continued)

FOREIGN PATENT DOCUMENTS

| | | |
|---|---|---|
| EP | 2383049 A1 | 11/2011 |
| JP | 2008-081812 A | 4/2008 |

OTHER PUBLICATIONS

PCT International Search Report for PCT/US2017/014615 dated Apr. 20, 2017.

(Continued)

*Primary Examiner* — Eric W Golightly

(74) *Attorney, Agent, or Firm* — Lowenstein Sandler LLP

(57) ABSTRACT

A method includes immersing an article comprising a yttrium based oxide in an acidic cleaning solution comprising water and 1-10 mol % HF acid. A portion of the yttrium based oxide is dissolved by the HF acid. A yttrium based oxy-fluoride is formed based on a reaction between the HF acid and the dissolved portion of the yttrium based. The yttrium based oxy-fluoride is precipitated onto the article over the yttrium based oxide to form a yttrium based oxy-fluoride coating. The acidic cleaning solution may include a yttrium based salt, which may additionally react with the HF acid to form more of the yttrium based oxy-fluoride.

20 Claims, 5 Drawing Sheets

(56) References Cited

U.S. PATENT DOCUMENTS

| | | |
|---|---|---|
| 9,045,679 B2 | 6/2015 | Buisette et al. |
| 2003/0190870 A1 | 10/2003 | Shih et al. |
| 2011/0036874 A1 | 2/2011 | Wang et al. |
| 2011/0104469 A1 | 5/2011 | Riman et al. |
| 2012/0211468 A1 | 8/2012 | Tan |
| 2014/0076354 A1 | 3/2014 | West et al. |
| 2014/0147594 A1 | 5/2014 | Jewhurst et al. |
| 2014/0190937 A1 | 7/2014 | Tan |
| 2014/0221188 A1 | 8/2014 | Banda et al. |

OTHER PUBLICATIONS

PCT Written Opinion of the International Searching Authority for PCT/US2017/014615 dated Apr. 20, 2017.

200 ↘

- Immerse article comprising a yttrium based oxide in an acidic cleaning solution comprising water and HF acid 210
- Dissolve portion of yttrium based oxide with HF acid 215
- Form yttrium based oxy-fluoride based on a reaction between the HF acid and the dissolved portion of the yttrium based oxide 220
- Precipitate the yttrium based oxy-fluoride onto the article over the yttrium based oxide to form a yttrium based oxy-fluoride coating 225
- Clean article using acidic cleaning solution 230

- Immerse article comprising a yttrium based oxide in an acidic cleaning solution comprising water, HF acid and a yttrium based salt 310
- Dissolve portion of yttrium based oxide with HF acid 315
- Form yttrium based oxy-fluoride based on a reaction between the HF acid and the dissolved portion of the yttrium based oxide 320
- Form additional yttrium based oxy-fluoride based on a reaction between the HF acid and the yttrium based salt 325
- Precipitate the yttrium based oxy-fluoride onto the article over the yttrium based oxide to form a yttrium based oxy-fluoride coating 330
- Clean article using acetic acid solution 335

FIG. 3

CLEANING PROCESS THAT PRECIPITATES
YTTRIUM OXY-FLOURIDE

TECHNICAL FIELD

Embodiments of the present invention relate, in general, to a cleaning process that may be used to clean ceramic articles and ceramic coated articles, and in particular to a cleaning process that forms an oxy-fluoride coating on a cleaned article.

BACKGROUND

Yttrium oxide based articles and articles that have yttrium oxide based coatings are frequently used in semiconductor processing. When yttrium oxide based articles and articles with yttrium oxide based coatings are exposed to fluorine plasma chemistries during plasma etch processing, the yttrium oxide reacts with the fluorine and forms a yttrium fluoride. The conversion of the yttrium oxide into the yttrium fluoride during plasma etch processing is accompanied by a volume expansion of up to 60%, which causes stress and/or blistering to occur at a surface of the article. The stress and/or blistering are causes of particle defects on processed substrates.

Furthermore, new articles or recently cleaned articles generally have a different material composition at a surface than used articles that have not recently been cleaned. The different surface composition of these articles can cause processing results such as etch rate to vary depending on a state of the articles. Accordingly, after a new article is created and placed into a chamber and after a used article has been cleaned and placed into a chamber, the chamber is seasoned to cause the material composition of the surface to become similar to the surface composition that develops after use of the article. To season the chamber, one or more processes are run in the chamber without product in the chamber for a predetermined amount of time. During the seasoning process (also referred to as a recovery process), the chamber is unavailable to process product.

SUMMARY

In one example implementation, a method includes immersing an article comprising a yttrium based oxide in an acidic cleaning solution comprising water and 1-10 mol % HF acid. A portion of the yttrium based oxide is dissolved by the HF acid. A yttrium based oxy-fluoride is formed based on a reaction between the HF acid and the dissolved portion of the yttrium based. The yttrium based oxy-fluoride is precipitated onto the article over the yttrium based oxide to form a yttrium based oxy-fluoride coating.

In a further example implementation, a method includes immersing an article comprising a yttrium based oxide in an acidic cleaning solution comprising water, 1-10 mol % HF acid and a yttrium based salt. A portion of the yttrium based oxide is dissolved by the HF acid. A yttrium based oxy-fluoride is formed based on 1) a reaction between the HF acid and the dissolved portion of the yttrium based oxide and 2) a reaction between the HF acid and the yttrium based salt. The yttrium based oxy-fluoride is precipitated onto the article over the yttrium based oxide to form a yttrium based oxy-fluoride coating.

In a further example implementation, a method includes immersing an article comprising a yttrium based oxide in an acidic cleaning solution comprising water, 1-10 mol % HF acid and 0.5-5 mol % of a yttrium based salt. A portion of the yttrium based oxide is dissolved by the HF acid. A yttrium based oxy-fluoride is formed based on 1) a reaction between the HF acid and the dissolved portion of the yttrium based oxide and 2) a reaction between the HF acid and the yttrium based salt. The yttrium based oxy-fluoride is precipitated onto the article over the yttrium based oxide to form a yttrium based oxy-fluoride coating. The yttrium based oxy-fluoride comprises a complex mixture of $Y(OH)_3$ and $YF_3$.

BRIEF DESCRIPTION OF THE DRAWINGS

Embodiments of the present invention are illustrated by way of example, and not by way of limitation, in the figures of the accompanying drawings. It should be noted that different references to "an" or "one" embodiment in this disclosure are not necessarily to the same embodiment, and such references mean at least one.

FIG. 2 illustrates a method of cleaning an article according to one embodiment.

FIG. 3 illustrates a method of cleaning an article according to one embodiment.

DETAILED DESCRIPTION

Embodiments are directed to processes for cleaning a ceramic article or an article that has a ceramic coating. Specifically, embodiments are directed to processes for cleaning a ceramic article that includes a yttrium based oxide or an article having a ceramic coating that includes a yttrium based oxide. The cleaning processes discussed herein are used to clean both ceramic articles that include a yttrium based oxide and articles that have ceramic coatings that include a yttrium based oxide. The cleaning processes use an acidic cleaning solution that includes a high enough concentration of HF acid (e.g., over 0.1 M) to react with the yttrium based oxide and form a yttrium based oxy-fluoride coating at a surface of the article. In some embodiments, the acidic cleaning solution further includes a yttrium based salt to facilitate the formation of the yttrium based oxy-fluoride coating. Advantageously, the yttrium based oxy-fluoride coating acts as a passivation layer and inhibits etching of the article. As a result, the etch rate of the acidic cleaning solution that contains HF acid surprisingly goes down with an increased concentration of HF when the acidic cleaning solution is used to clean articles having yttrium based oxide at their surface. In embodiments an acidic cleaning solution with a molarity of at least 0.1 Molarity (M) is used.

The yttrium based oxy-fluoride coating that is formed on the surface of articles in embodiments has a similar composition to yttrium oxy-fluoride coatings that are formed on the surface of yttrium based oxide articles after processing in a fluorine plasma, such as during a plasma etch process using a fluorine plasma. Ordinarily an article undergoes seasoning for an extended time period after cleaning to cause the article to have a yttrium oxy-fluoride film at the surface of the article. By cleaning articles using the acidic cleaning solution described herein, the seasoning process can be significantly reduced or completely eliminated. For example, the seasoning or recovery time may be reduced between 50-100%.

Since the formation of the yttrium based oxy-fluoride is performed during a cleaning process in embodiments, any loose particles that might be produced by the formation (e.g., due to blistering or stress caused by the formation of the yttrium based oxy-fluoride) are beneficially removed from the article as a result of the cleaning process. Accordingly, the cleaning processes discussed herein reduce down time of tools and reduce particle defects on substrates caused by articles.

When the terms "about" and "approximately" are used herein, these are intended to mean that the nominal value presented is precise within ±10%.

Figure 1:
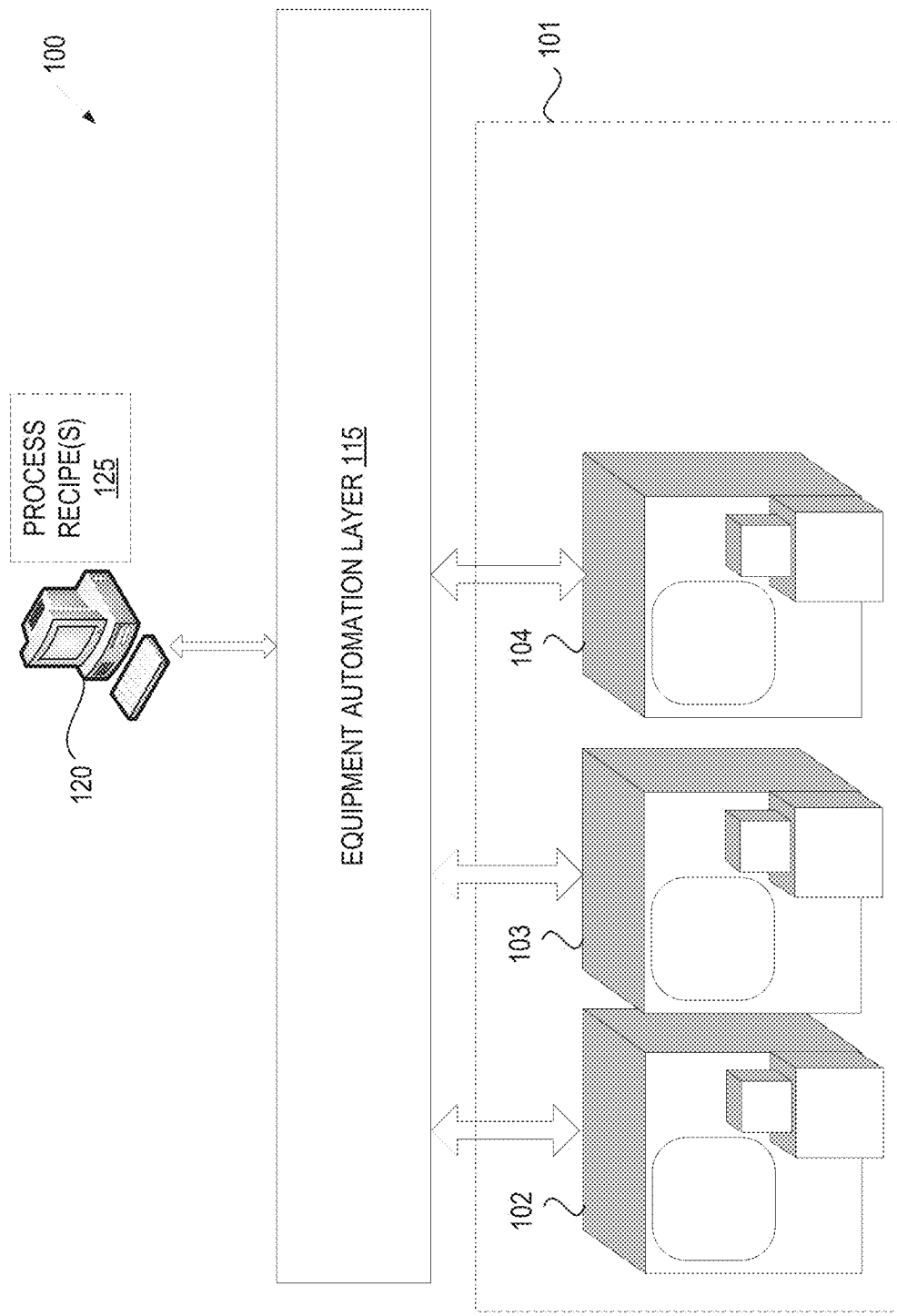
FIG. 1 illustrates an example architecture of a manufacturing system, in accordance with embodiments discussed herein.

FIG. 1 illustrates an example architecture of a manufacturing system 100, in accordance with embodiments of the present invention. The manufacturing system 100 may be a system for cleaning new and/or used articles. The cleaned new and/or used articles may be chamber components for semiconductor manufacturing equipment. In one embodiment, the new and/or used articles are chamber components used in plasma etchers or plasma cleaners. The plasma etchers or plasma cleaners may or may not be used for manufacturing semiconductors. Examples of articles include a substrate support assembly, an electrostatic chuck (ESC), a ring (e.g., a process kit ring or single ring), a chamber wall, a base, a gas distribution plate, a showerhead, a nozzle, a lid, a chamber liner, a liner kit, a shield, a plasma screen, a flow equalizer, a cooling base, a chamber viewport, a chamber lid, and so on.

The manufacturing system 100 includes processing equipment 101 connected to an equipment automation layer 115. The processing equipment 101 may include a first wet cleaner 102, a second wet cleaner 103, a third wet cleaner 104 and/or one or more additional wet cleaners (not shown). The manufacturing system 100 may further include one or more computing device 120 connected to the equipment automation layer 115. In alternative embodiments, the manufacturing system 100 may include more or fewer components. For example, the manufacturing system 100 may include manually operated (e.g., off-line) processing equipment 101 without the equipment automation layer 115 or the computing device 120.

Wet cleaners 102-104 are cleaning apparatuses that clean new and/or used articles using a wet clean process. Wet cleaners 102-104 include wet baths filled with liquids, in which an article is immersed to clean the article. Wet cleaners 102-104 may agitate the wet bath using ultrasonic waves during cleaning to improve a cleaning efficacy. This is referred to herein as sonicating or ultrasonicating the wet bath.

In one embodiment, first wet cleaner 102 includes an acidic cleaning solution that both cleans the articles and deposits a yttrium oxy-fluoride coating on the articles during the cleaning process. In one embodiment, second wet cleaner 103 includes a basic solution (also referred to as an alkaline solution) that further cleans articles. Articles may be alternately immersed in the acidic cleaning solution in the first wet cleaner 102 and the basic cleaning solution in the second wet cleaner 103 to better remove particles from the article. In one embodiment, third wet cleaner 104 includes a bath of deionized (DI) water. Some or all of the first wet cleaner 102, second wet cleaner 103 and third wet cleaner 104 may ultrasonicate the baths and/or cleaning solutions during cleaning processes.

The equipment automation layer 115 may interconnect some or all of the processing equipment 101 (also referred to as manufacturing machines) with computing devices 120, with other manufacturing machines, with metrology tools and/or other devices. The equipment automation layer 115 may include a network (e.g., a location area network (LAN)), routers, gateways, servers, data stores, and so on. Processing equipment 101 may connect to the equipment automation layer 115 via a SEMI Equipment Communications Standard/Generic Equipment Model (SECS/GEM) interface, via an Ethernet interface, and/or via other interfaces. In one embodiment, the equipment automation layer 115 enables process data (e.g., data collected by processing equipment 101 during a process run) to be stored in a data store (not shown). In an alternative embodiment, the computing device 120 connects directly to one or more of the processing equipment 101.

In one embodiment, some or all processing equipment 101 include a programmable controller that can load, store and execute process recipes. The programmable controller may control temperature settings, gas and/or vacuum settings, time settings, etc. of processing equipment 101. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

In one embodiment, the processing equipment 101 are programmed to execute recipes that will cause the manufacturing machines to clean an article. Different recipes may be used to clean different types of articles. For example, a first recipe may be used to clean lids, a second recipe may be used to clean showerheads, and a third recipe may be used to clean electrostatic chucks. The computing device 120 may store one or more process recipes 125 for cleaning articles that can be downloaded to the processing equipment 101 to cause the processing equipment 101 to clean articles in accordance with embodiments of the present invention.

Various cleaning processes are described with reference to FIGS. 2-5. The cleaning processes described with reference to FIGS. 2-5 may be used as standalone recipes for cleaning articles. Alternatively, the cleaning processes of FIGS. 2-5 may be used as steps in cleaning recipes that may include additional cleaning stages. The additional cleaning stages in some cleaning recipes may be performed before the operations described with reference to one or more of FIGS. 2-5, in between the operations described with reference to one or more of FIGS. 2-5 and/or after the operations described with reference to one or more of FIGS. 2-5.

FIG. 2 is a flow chart of a process 200 for cleaning an article, in accordance with embodiments of the present invention. The operations of process 200 may be performed by various manufacturing machines, as set forth in FIG. 1.

At block 210 of process 200, an article comprising a yttrium based oxide is immersed in an acidic cleaning solution. The article may be immersed in the acidic cleaning solution for a duration of about 1 minute to about 2 hours. In one embodiment, the article is immersed in the acidic cleaning solution one or more times, where for each immersion the article is in the acidic cleaning solution for about 1-10 minutes. In one embodiment, each immersion in the acidic cleaning solution is for about 3 minutes.

In one embodiment the article is or includes a bulk sintered ceramic that is composed of a yttrium based oxide. For example, the article may be a lid that is formed from a yttrium based oxide. In another embodiment, the article is a metal article, a ceramic article that does not include a yttrium based oxide (e.g., a SiO2 or $Al_2O_3$ article), or a combination thereof. Any of the aforementioned articles may or may not have a ceramic coating that is composed of a yttrium based oxide. The ceramic coating may have been deposited by any deposition technique, such as thermal spraying, plasma spraying, sputtering, evaporation, ion assisted deposition (IAD), physical vapor deposition (PVD), dip coating, and so on.

Some examples of yttrium based oxides that may be used for articles and/or for coatings include yittria ($Y_2O_3$), yttria stabilized zirconia (YSZ), yttrium aluminum garnet ($Y_3Al_5O_{12}$, known as YAG), yttrium aluminum monoclinic ($Y_4Al_2O_9$, known as YAM), or other ceramics. The yttrium based oxide may also include one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In one embodiment, the yttrium based oxide is a ceramic compound comprising $Y_4Al_2O_9$ and a solid-solution of $Y_2O_3$—$ZrO_2$. In one embodiment, the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

In one embodiment, the yttrium based oxide is a ceramic compound that includes a combination of $Y_2O_3$, $ZrO_2$, $Er_2O_3$, $Gd_2O_3$ and $SiO_2$. In one embodiment, the ceramic compound can include $Y_2O_3$ in a range of 40-45 mol %, $ZrO_2$ in a range of 0-10 mol %, Er2O3 in a range of 35-40 mol %, Gd2O3 in a range of 5-10 mol % and SiO2 in a range of 5-15 mol %. In a first example, the ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the ceramic compound includes 40 mol % $Y_2O_3$, 5 mol % $ZrO_2$, 40 mol % $Er_2O_3$, 7 mol % $Gd_2O_3$ and 8 mol % $SiO_2$.

In one embodiment, the yttrium based oxide is a ceramic compound that includes a combination of $Y_2O_3$, $ZrO_2$, $Er_2O_3$, and $Al_2O_3$. In one embodiment, the ceramic compound includes 25 mol % $Y_2O_3$, 25 mol % $ZrO_2$, 25 mol % $Er_2O_3$, and 25 mol % $Al_2O_3$.

In one embodiment, the yttrium based oxide is a ceramic compound that includes a combination of $Y_2O_3$, $Gd_2O_3$ and $Al_2O_3$. The ceramic compound may include 6.9-22.1 mol % $Y_2O_3$, 14.1-44.9 mol % $Gd_2O_3$, and 33.0-79 mol % $Al_2O_3$. In one embodiment, the ceramic compound includes 22.1 mol % $Y_2O_3$, 44.9 mol % $Gd_2O_3$ and 33.0 mol % $Al_2O_3$. In another embodiment, the ceramic compound includes 16.5 mol % $Y_2O_3$, 33.5 mol % $Gd_2O_3$ and 50.0 mol % $Al_2O_3$. In another embodiment, the ceramic compound includes 12.5 mol % $Y_2O_3$, 25.5 mol % $Gd_2O_3$ and 62.0 mol % $Al_2O_3$. In another embodiment, the ceramic compound includes 6.9 mol % $Y_2O_3$, 14.1 mol % $Gd_2O_3$ and 79.0 mol % $Al_2O_3$.

The acidic cleaning solution is a cleaning solution that includes water and HF acid. Notably, an increased concentration of HF actually reduces the etch rate rather than increases the etch rate when used to etch yttrium based oxides. Moreover, increasing the concentration of HF increases the concentration of available fluorine ions for reaction with the yttrium in the yttrium based oxide in the article or coating. In some embodiments, the acidic cleaning solution does not include a buffer for the HF.

Figure 6:
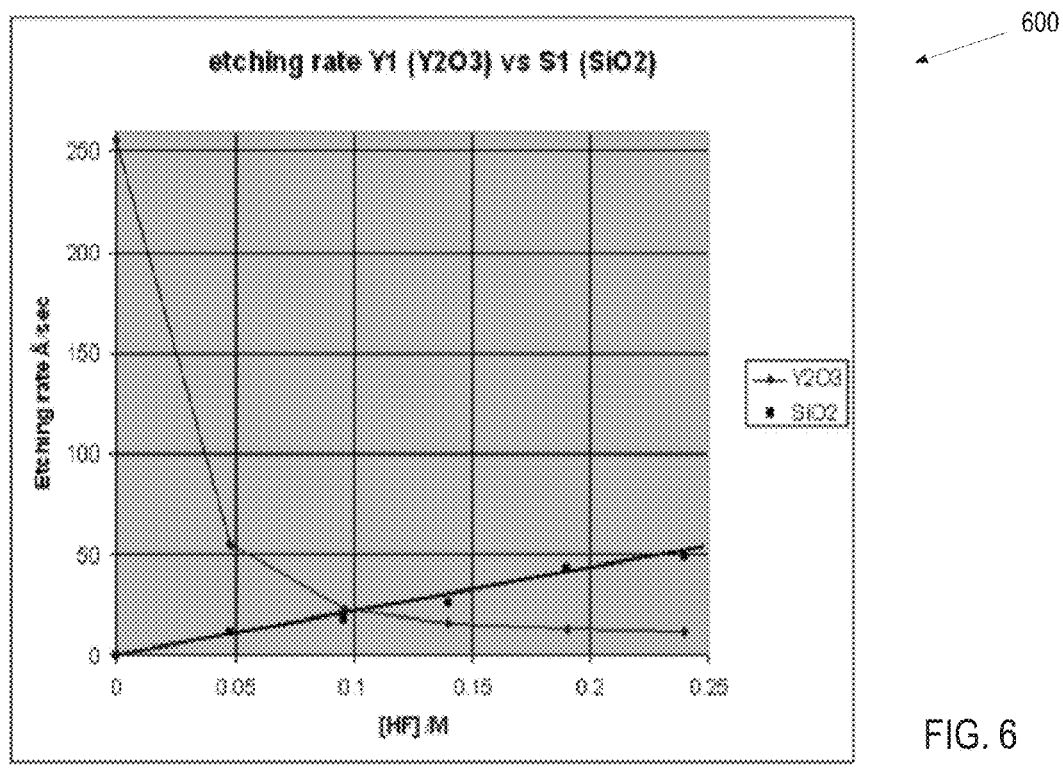
FIG. 6 is a chart showing an etch rate of yttria and silicon dioxide for varying concentrations of hydrofluoric acid.

Referring to FIG. 6, FIG. 6 is a chart showing an etch rate of yttria and silicon dioxide for varying concentrations of hydrofluoric acid. As shown, the etch rate of $SiO_2$ increases approximately linearly with increases in the Molarity of HF. The etch rate of yttria is reduced significantly with increased concentration of HF up to a concentration of 0.1 Molar. Further increases in the concentration of HF further reduces the etch rate of yttria to a lesser extent.

Referring back to FIG. 2, in one embodiment, the acidic cleaning solution contains at least 0.1 Molarity of HF. In one embodiment, the acidic cleaning solution contains 0.1-0.25 Molarity of HF. In one embodiment, the acidic cleaning solution contains 0.1-1.0 Molarity of HF. In one embodiment, the acidic cleaning solution contains 1-5 Molarity of HF. In one embodiment, the acidic cleaning solution contains 1-10 Molarity of HF. In terms of molar ratio, in one embodiment, the acidic cleaning solution contains 1-10 mol % of HF. In one embodiment, the acidic cleaning solution contains 5-10 mol % of HF. In one embodiment, the acidic cleaning solution contains 10-30 mol % of HF. In one embodiment, the acidic cleaning solution contains 1-30 mol % of HF.

In one embodiment, the acidic cleaning solution further includes an additional acid. The additional acid may be nitric acid ($HNO_3$), hydrochloric acid (HCl), or sulfuric acid ($H_2SO_4$). In one embodiment, the acidic cleaning solution contains 1-20 mol % of the additional acid. In a further embodiment, the acidic cleaning solution contains 1-5 mol % of the additional acid.

In one embodiment, the acidic cleaning solution further includes 0.5-5.0 mol % ammonium fluoride. In one embodiment, the acidic cleaning solution further includes 0.5-5.0 mol % ammonium fluoride, and 1-5 mol % of the additional acid.

The HF acid reacts with the surface of the article (or the surface of the coating on the article). The chemical reaction of the HF with the yttrium based oxide at the surface caused fluoridation of the surface. In one embodiment, the acidic cleaning solution has a temperature of between room temperature (about 21° C.) and 100° C. In one embodiment, the acidic cleaning solution has a temperature of about 55° C. to about 100° C. Fluorination at the lower temperature causes a better structure to be generated that can accommodate later exposure to fluorine chemistries.

At block 215, the HF acid in the acidic cleaning solution dissolves a portion of the yttrium based oxide. At block 220, the dissolved yttrium based oxide reacts with the HF to form a yttrium based fluoride or a yttrium based oxy-fluoride. In most instances not all of the oxygen will be replaced with fluorine. Accordingly, a yttrium based oxy-fluoride is generally formed.

At block 225, the yttrium based oxy-fluoride (or yttrium based fluoride) precipitates onto the article over the yttrium based oxide to form a yttrium based oxy-fluoride coating. In one embodiment, the yttrium based oxy-fluoride comprises a complex mixture of yttrium hydroxide (e.g., $Y(OH)_3$) and yttrium fluoride ($YF_3$). The complex mixture may also include water ($H_2O$). In one embodiment, the yttrium based oxy-fluoride coating has an empirical formula of $YO_xF_y$, where x is 0.7-1.4 and y is 0.1-0.8. In one embodiment, the yttrium based oxy-fluoride coating has a thickness of 1-100 nanometers (nm). In one embodiment, the yttrium based oxy-fluoride coating has a thickness of 10-200 nm. In one embodiment, the yttrium based oxy-fluoride coating has a thickness of 15-200 nm. In one embodiment, the yttrium based oxy-fluoride has a thickness of approximately 10 nanometers to 1 micron. In one embodiment, the yttrium based oxy-fluoride has a thickness of approximately 1-20 nanometers.

At block 230, the article is additionally cleaned by the acidic cleaning solution. Cleaning the article may include removing loose particles from the article. The loose particles may be dissolved by the acidic cleaning solution, or may simply be removed without having been dissolved. If the article is a used article, cleaning the article may include etching away or otherwise removing layers that have been deposited on the article during processing. The cleaning of the article may occur contemporaneously with the fluorination of the yttrium based oxide at the surface of the article and/or may be performed prior to the fluorination of the surface of the article. Accordingly, soaking the article in the acidic cleaning solution both cleans the article and performs a surface treatment of the article.

FIG. 3 is a flow chart of a process 300 for cleaning an article, in accordance with embodiments of the present invention. The operations of process 300 may be performed by various manufacturing machines, as set forth in FIG. 1. Process 300 produces a similar yttrium based oxy-fluoride coating to the yttrium based oxy-fluoride coating produced by process 200, and shares all of the same advantages over prior cleaning solutions for yttrium oxide based articles. Process 300 is capable of producing thicker yttrium based oxy-fluoride coatings than process 200.

At block 310 of process 300, an article comprising a yttrium based oxide is immersed in an acidic cleaning solution. The article may be immersed in the acidic cleaning solution for a duration of about 1 minute to about 2 hours. In one embodiment, the article is immersed in the acidic cleaning solution one or more times, where for each immersion the article is in the cleaning solution for about 1-10 minutes. In one embodiment, the article is immersed in the acidic cleaning solution for about 3 minutes each time.

The article may correspond to any of the articles discussed with reference to FIG. 2. The acidic cleaning solution is a cleaning solution that includes water, HF acid and a yttrium salt (also referred to as a yttrium based salt). In one embodiment, the acidic cleaning solution contains at least 0.1 Molarity of HF. In one embodiment, the acidic cleaning solution contains 0.1-0.25 Molarity of HF. In one embodiment, the acidic cleaning solution contains 0.1-1.0 Molarity of HF. In one embodiment, the acidic cleaning solution contains 1-5 Molarity of HF. In one embodiment, the acidic cleaning solution contains 1-10 Molarity of HF. In terms of molar ratio, in one embodiment, the acidic cleaning solution contains 1-10 mol % of HF. In one embodiment, the acidic cleaning solution contains 5-10 mol % of HF. In one embodiment, the acidic cleaning solution contains 10-30 mol % of HF. In one embodiment, the acidic cleaning solution contains 1-30 mol % of HF.

In order to increase an amount of yttrium that may react with the HF to form a yttrium based fluoride and/or a yttrium based oxy-fluoride, a yttrium salt is added to the acidic cleaning solution. The addition of the yttrium salt may increase a thickness of a yttrium based oxy-fluoride coating that is ultimately formed on a cleaned article. The amount of yttrium salt that is added to the acidic cleaning solution may be based on the solubility limit of the yttrium salt in the acidic cleaning solution. Preferably, the amount of yttrium salt that is added to the acidic cleaning solution is below the solubility limit. An amount of yttrium salt up to the solubility limit of that yttrium salt may be added to the acidic cleaning solution. In one embodiment, the amount of the yttrium salt in the acidic cleaning solution is 0.5-5 mol %.

Various different yttrium salts may be added to the acidic cleaning solution individually or together. Some yttrium salts that may be added to the acidic cleaning solution include yttrium nitrate ($Y(NO_3)_3$) and yttrium chloride ($YCl_3$). Other yttrium salts may also be used. Any one of these yttrium salts may be added to the acidic cleaning solution up to the solubility limit. Alternatively, combinations of two or more of these yttrium salts may be added to the acidic cleaning solution up to the solubility limit.

In one embodiment, ammonium fluoride ($NH_4F$) is added to the acidic cleaning solution to increase a concentration of fluorine in the acidic cleaning solution. In one embodiment, 0.5-5.0 mol % of ammonium fluoride is added to the acidic cleaning solution.

In one embodiment, the acidic cleaning solution further includes an additional acid. The additional acid may be nitric acid ($HNO_3$), hydrochloric acid (HCl), or sulfuric acid ($H_2SO_4$). In one embodiment, the acidic cleaning solution contains 1-20 mol % of the additional acid. In a further embodiment, the acidic cleaning solution contains 1-5 mol % of the additional acid. The additional acid may increase a speed at which the fluorine salts are dissolved in the acidic cleaning solution. In one embodiment, the acidic cleaning solution contains 0.5-5.0 mol % ammonium fluoride and 1-5 mol % of the additional acid.

In one embodiment, the acidic acid cleaning solution further includes chlorine. The acidic cleaning solution may also include both the chlorine and the additional acid in addition to the HF acid and the fluorine salt. The acidic cleaning solution may also include the chlorine, the additional acid and the ammonium fluoride. The amount of chlorine that is added to the acidic cleaning solution may be 5-10 mol % in embodiments.

In one embodiment, the acidic cleaning solution further includes a dispersant. One example of a dispersant for $Y_2O_3$ is ammonium citrate ($(NH_4)_2C_6H_6O_7$). The dispersant may provide good particle dispersion properties through the static hindrance effect. The acidic cleaning solution may contain 0.1-2.0 mol % of the dispersant. In one embodiment, the acidic cleaning solution contains 0.5-1.5 mol % of the dispersant. In one embodiment, the acidic cleaning solution contains 1.0 mol % of the dispersant. The acidic cleaning solution may additionally include any combination of the chlorine, the additional acid and the dispersant.

The HF acid reacts with the surface of the article (or the surface of the coating on the article). The chemical reaction of the HF with the yttrium based oxide at the surface causes fluoridation of the surface. In one embodiment, the acidic cleaning solution has a temperature of between room temperature (about 21° C.) and 100° C. In one embodiment, the acidic cleaning solution has a temperature of 55° C. to 100° C.

At block 315, the HF acid in the acidic cleaning solution dissolves a portion of the yttrium based oxide. At block 320, the dissolved yttrium based oxide reacts with the HF to form a yttrium based fluoride or a yttrium based oxy-fluoride. At block 325, additional yttrium based oxy-fluoride is formed based on a reaction between the HF acid and the yttrium salt. At block 330, the yttrium based oxy-fluoride (or yttrium based fluoride) precipitates onto the article over the yttrium based oxide to form a yttrium based oxy-fluoride coating. In one embodiment, the yttrium based oxy-fluoride coating has a thickness of 10 nm to 1 micron. In one embodiment, the yttrium based oxy-fluoride coating has a thickness of 20 nm to 1 micron. In one embodiment, the yttrium based oxy-fluoride coating has a thickness of 50 nm to 1 micron.

In one embodiment, the yttrium based oxy-fluoride comprises a complex mixture of yttrium hydroxide (e.g., $Y(OH)_3$) and yttrium fluoride ($YF_3$). The complex mixture may also include water ($H_2O$). In one embodiment, the yttrium based oxy-fluoride coating has an empirical formula of $YO_xF_y$, where x is 0.7-1.4 and y is 0.1-0.8.

Yttrium based oxides and yttrium salts are slightly soluble in HF and soluble in other acids such as nitric acid. Yttrium based fluorides are generally not soluble in HF or other acids. This permits the HF and other acid such as nitric acid to both dissolve the yttrium based oxide and precipitate out the yttrium based fluoride and/or yttrium based oxy-fluoride.

At block 330, the article is additionally cleaned by the acidic cleaning solution. Cleaning the article may include removing loose particles from the article. The loose particles may be dissolved by the acidic cleaning solution, or may simply be removed without having been dissolved. If the article is a used article, cleaning the article may include etching away or otherwise removing layers that have been deposited on the article during processing. The cleaning of the article may occur contemporaneously with the fluoridation of the yttrium based oxide at the surface of the article and/or may be performed prior to the fluoridation of the surface of the article.

Figure 4:
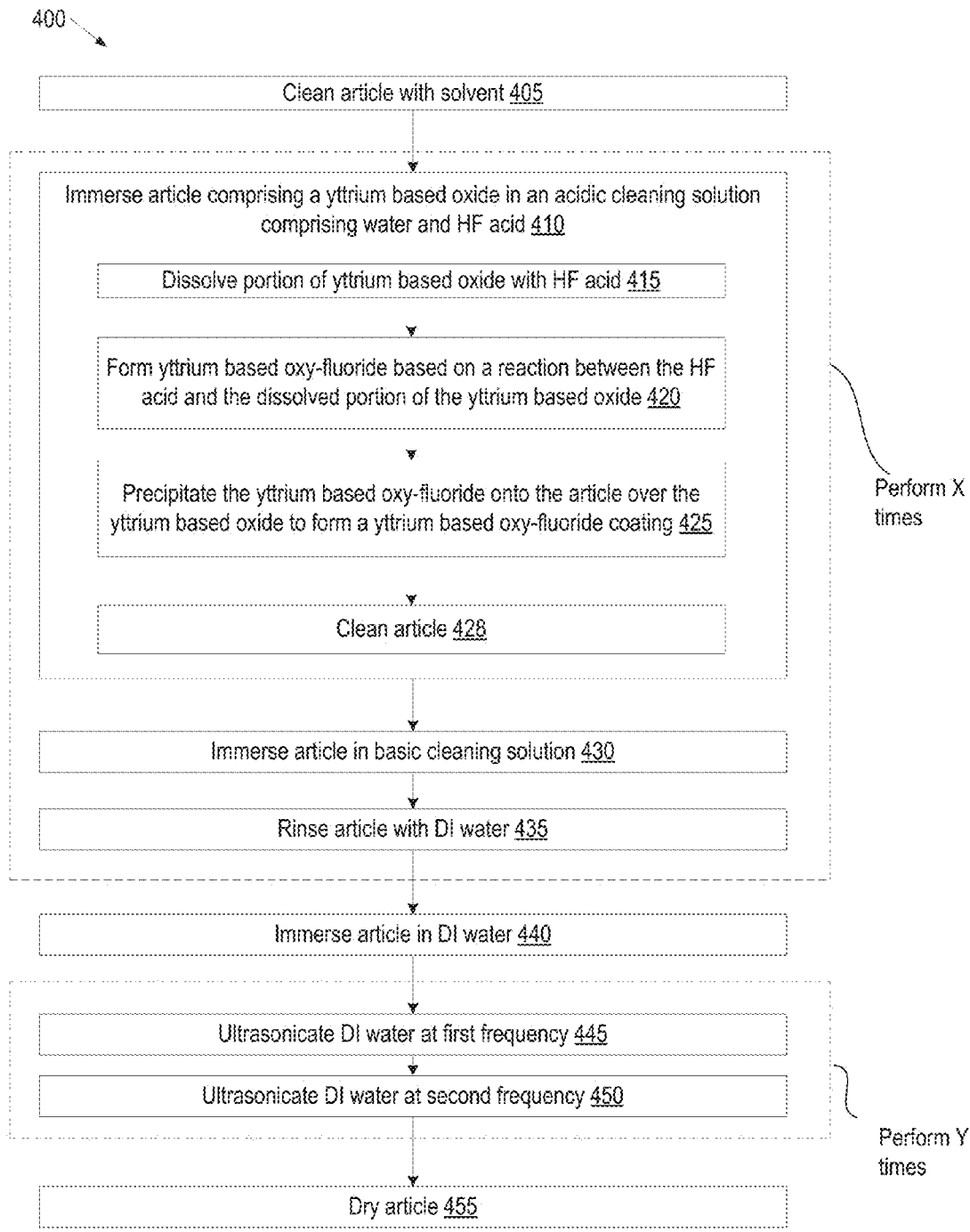
FIG. 4 illustrates a method of cleaning an article according to one embodiment.

FIG. 4 illustrates a process 400 of cleaning an article according to one embodiment. The operations of process 400 may be performed by various manufacturing machines, as set forth in FIG. 1.

At block 405 of process 400, an article comprising a yttrium based oxide (e.g., having a body of a yttrium based oxide and/or a coating of a yttrium based oxide) is cleaned with a solvent. The solvent causes surface wetting of the article and can remove organic contaminants and/or facilitate removal of organic contaminants. In one embodiment, the article is wiped with a cloth or pad that includes the solvent. In another embodiment, the article is dipped into a bath of the solvent. The article may correspond to any of the articles previously described herein. In one embodiment, the solvent is isopropyl alcohol (IPA).

At block 410, the article is immersed in an acidic cleaning solution comprising water and HF acid. The acidic cleaning solution does not include an HF buffer in some embodiments. The acidic cleaning solution may correspond to any of the acidic cleaning solutions discussed with reference to process 200. While the article is immersed in the acidic cleaning solution, the operations of blocks 415-428 may be performed. At block 415 a portion of the yttrium based oxide is dissolved by the HF acid. At block 420, yttrium based oxy-fluoride and/or yttrium based fluoride is formed based on reaction between the HF acid and the dissolved portion of the yttrium based oxide. At block 425, the yttrium based oxy-fluoride and/or yttrium based fluoride is precipitated onto the article over the yttrium based oxide to form a yttrium based oxy-fluoride coating. At block 428, the acidic cleaning solution cleans the article. Blocks 415-428 may correspond to blocks 215-230 of process 200.

At block 430, the article is immersed in a basic cleaning solution. The basic cleaning solution comprises water and an alkaline. The alkaline may be ammonium hydroxide ($NH_4OH$), tetramethylammonium hydroxide ($N(CH_3)_4^+$ $OH^-$, known as TMAH), or a combination thereof. In one embodiment, the basic cleaning solution includes 5-10 mol % of the alkaline. The basic cleaning solution may have a temperature that ranges from room temperature to about 100° C. In one embodiment, the basic cleaning solution has a temperature of 55° C. to 100° C. The article may be immersed in the basic cleaning solution for about 30-60 minutes. At block 435, the article is rinsed with deionized (DI) water.

The article may be immersed in the basic cleaning solution before or after the article is immersed in the acidic cleaning solution. If the article is first immersed in the basic cleaning solution, then the operations of block 430 may be performed prior to the operations of block 410, after which the operations of block 435 may be performed.

The operations of blocks 410-435 may be performed a predetermined number (e.g., X number) of times or cycles. Process 400 may alternate between immersing the article in the acidic cleaning solution and immersing the article in the basic cleaning solution for the predetermined number of cycles. In one embodiment, the predetermined number of cycles is 5-20 cycles. In one embodiment, the predetermined number of cycles is 8-10 cycles. In one embodiment, the predetermined number of cycles is 10 cycles. The acidic cleaning solution is better at removing some types of materials (e.g., yttria and alumina) from the article and the basic cleaning solution is better at removing other types of materials (e.g., silicon) from the article. By using both the acidic cleaning solution and the basic cleaning solution, more contaminants can be removed from the article.

At the iso-electric point for the yttrium based oxide, the charge on the surface of the yttrium based oxide is zero. By alternating between immersion of the article in the acidic cleaning solution and the basic cleaning solution, the surface charge of the article and any particles on the article may be alternated around the iso-electric point for the yttrium based oxide. In other words, the article and/or surface particles may be alternated between a positive surface charge and a negative surface charge. Alternating between the positive surface charge and the negative surface charge may cause a repulsive force between the article's surface and particles (e.g., contaminants) on the article's surface. The acidic cleaning solution and/or the basic cleaning solution dissolve particles on the article, and the repulsive force facilitates removal of the dissolved particles from the article's surface.

Some particles may be too small to easily remove the particles from the article. Alternating between immersion of the article the acidic cleaning solution and the basic cleaning solution to alternately change the surface of the article between a positive charge and a negative charge can cause small particles to agglomerate together. These agglomerated particles essentially form a single larger particle that may then be removed by ultrasonication.

At block 440 the article is immersed in a bath of DI water. The DI water may have a temperature that ranges from room temperature to about 100° C. At block 445, the DI water bath is ultrasonicated at a first frequency. The DI water may be ultrasonicated at the first frequency for a duration of about 5-120 minutes. In one embodiment, the DI water is ultrasonicated at the first frequency for a duration of 10 minutes. In one embodiment, the DI water is ultrasonicated for a duration of 40 minutes. The ultrasonication may be performed at a power of 10-50 Watt/inch$^2$. In one embodiment, the ultrasonication at the first frequency is performed at a power of 45 Watt/inch$^2$. In one embodiment, the ultrasonication is performed at a power of 10 Watt/inch$^2$, a frequency of 40 kHz and a duration of 40-120 minutes. In one embodiment, the ultrasonication is performed at a power of 25 Watts/inch$^2$, a frequency of 40 kHz, and a duration of 15-40 minutes. In one embodiment, the ultrasonication is performed at a frequency of 40 kHz, a power of 45 Watt/inch$^2$ and a duration of 3 minutes. The first frequency may be less than 100 kHz. In one embodiment, the first frequency is 25-100 kHz. In another embodiment, the first frequency is 25-50 kHz. In another embodiment, the first frequency is 40 kHz.

The process 400 may alternate between different power levels for the ultrasonicating at the first frequency. The process may apply a power of 45 Watt/inch$^2$ for 2-10 minutes and may apply a power of 15 Watt/inch$^2$ for 5-20 minutes. In one embodiment, the DI water is ultrasonicated at 45 Watt/inch$^2$ at 40 kHz for 3 minutes and is additionally ultrasonicated at 15 Watt/inch$^2$ at 40 kHz for 15 minutes.

At block 450, the DI water bath is ultrasonicated at a second frequency. The DI water may be ultrasonicated at the second frequency for a duration of about 5-120 minutes. In one embodiment, the DI water is ultrasonicated at the second frequency for a duration of 10-15 minutes. The ultrasonication may be performed at a power of 10-50 Watt/inch$^2$. In one embodiment, the ultrasonication at the first frequency is performed at a power of 25 Watt/inch$^2$. The second frequency may be more than 100 kHz. In one embodiment, the second frequency is 100 kHz-2 MHz. In another embodiment, the second frequency is 100-500 kHz. In another embodiment, the second frequency is 110-200 kHz. In another embodiment, the second frequency is 110 kHz. In another embodiment, the second frequency is 132 kHz.

The process 400 may alternate between different power levels for the ultrasonicating at the second frequency. For the process may apply a power of 45 Watt/inch$^2$ for 2-15 minutes and may apply a power of 15 Watt/inch$^2$ for 2-15 minutes.

Large particles and small particles respond differently to various ultrasonic frequencies. Ultrasonicating the DI water at a relatively high frequency (e.g., over 100 kHz) causes removal of small particles (e.g., particles that are sub-micron sized, such as particles having a diameter of about 30 nanometers to 0.2 microns). Ultrasonicating the DI water at a relatively low frequency (e.g., under 100 kHz) causes removal of large particles (e.g., particles that are micron sized, such as particles having a diameter of about 0.5 micron, 1.0 micron or larger). By tailoring the frequency at which the ultrasonicating is performed, both large and small particles may be targeted for removal.

The operations of block 445 and block 450 may be performed a predetermined number (e.g., Y number) of times or cycles. In one embodiment, for process 400 the operations of block 445 and 450 are alternated for 2-5 cycles. In one embodiment, the predetermined number of cycles is 3 cycles.

Higher power (e.g., a power of 40-50 Watt/inch$^2$) for the ultrasonicating can cause pitting at the surface of the article. Regions where pitting occurs may correspond to areas where there were cracks, loosely bonded particles, surface nodules, pores, machining damage, or other weaknesses. By removal of material at the regions with weaknesses to cause pitting, the regions are no longer sources of particle defects on processed substrates. The pitting may improve performance of the article with respect to particles added to processed substrates.

At block 455, the article is dried.

Figure 5:
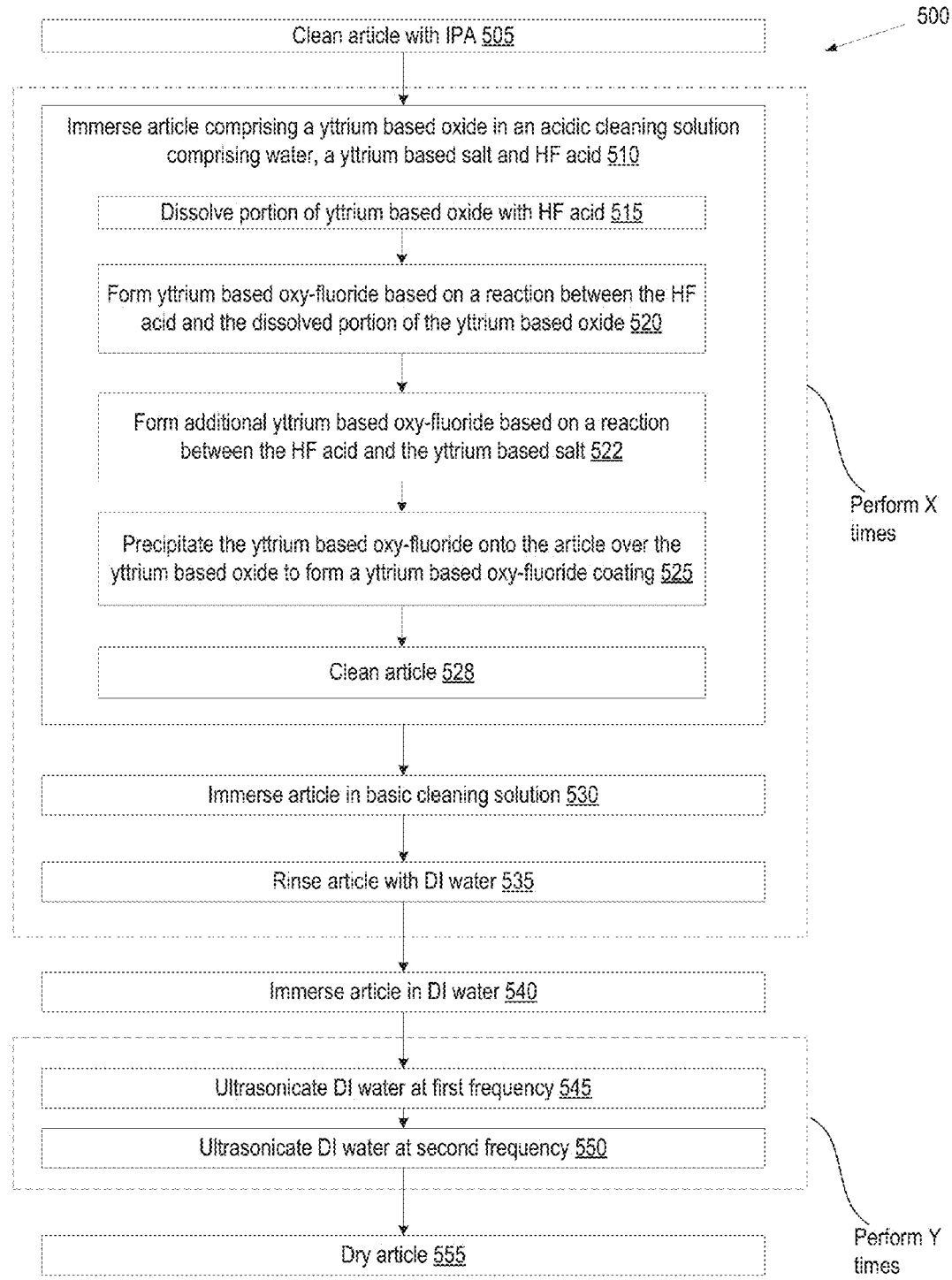
FIG. 5 illustrates a method of cleaning an article according to one embodiment.

FIG. 5 illustrates a process 500 of cleaning an article according to one embodiment. The operations of process 500 may be performed by various manufacturing machines, as set forth in FIG. 1.

At block 505 of process 500, an article comprising a yttrium based oxide (e.g., having a body of a yttrium based oxide and/or a coating of a yttrium based oxide) is cleaned with a solvent. The solvent causes surface wetting of the article and can remove organic contaminants and/or facilitate removal of organic contaminants. In one embodiment, the article is wiped with a cloth or pad that includes the solvent. In another embodiment, the article is dipped into a bath of the solvent. The article may correspond to any of the articles previously described herein. In one embodiment, the solvent is isopropyl alcohol (IPA).

At block 510, the article is immersed in an acidic cleaning solution comprising water, HF acid and a yttrium based salt. In some embodiments, the acidic cleaning solution does not include an HF buffer. The acidic cleaning solution may correspond to any of the acidic cleaning solutions discussed with reference to process 300. While the article is immersed in the acidic cleaning solution, the operations of blocks 515-528 may be performed. At block 515 a portion of the yttrium based oxide is dissolved by the HF acid. At block 520, yttrium based oxy-fluoride and/or yttrium based fluoride is formed based on reaction between the HF acid and the dissolved portion of the yttrium based oxide. At block 522, additional yttrium based oxy-fluoride and/or yttrium based fluoride is formed based on reaction between the HF acid and the yttrium based salt. At block 525, the yttrium based oxy-fluoride and/or yttrium based fluoride is precipitated onto the article over the yttrium based oxide to form a yttrium based oxy-fluoride coating. At block 528, the acidic cleaning solution cleans the article. Blocks 515-528 may correspond to blocks 315-335 of process 300.

At block 530, the article is immersed in a basic cleaning solution. The basic cleaning solution comprises water and an alkaline. The may be ammonium hydroxide (NH$_4$OH), tetramethylammonium hydroxide (N(CH$_3$)$_4$$^+$OH$^-$, known as TMAH), or a combination thereof. In one embodiment, the basic cleaning solution includes 5-10 mol % of the alkaline. The cleaning solution may have a temperature that ranges from room temperature to about 100° C. The article may be immersed in the basic cleaning solution for about 30-60 minutes. At block 535, the article is rinsed with deionized (DI) water.

The article may be immersed in the basic cleaning solution before or after the article is immersed in the acidic cleaning solution. If the article is first immersed in the basic cleaning solution, then the operations of block 530 may be performed prior to the operations of block 510, after which the operations of block 535 may be performed.

The operations of blocks 510-535 may be performed a predetermined number (e.g., X number) of times or cycles. Process 500 may alternate between immersing the article in the acidic cleaning solution and immersing the article in the basic cleaning solution for the predetermined number of cycles. In one embodiment, the predetermined number of cycles is 5-20 cycles. In one embodiment, the predetermined number of cycles is 8-10 cycles. In one embodiment, the predetermined number of cycles is 10 cycles. The acidic cleaning solution is better at removing some types of materials (e.g., yttria and alumina) from the article and the basic cleaning solution is better at removing other types of materials (e.g., silicon) from the article. By using both the acidic cleaning solution and the basic cleaning solution, more contaminants can be removed from the article.

At block 540 the article is immersed in a bath of DI water. The DI water may have a temperature that ranges from room temperature to about 100° C. At block 545, the DI water bath is ultrasonicated at a first frequency. The DI water may be ultrasonicated at the first frequency for a duration of about 5-120 minutes. In one embodiment, the DI water is ultrasonicated at the first frequency for a duration of 10 minutes. In one embodiment, the DI water is ultrasonicated for a duration of 40 minutes. The ultrasonication may be performed at a power of 10-50 Watt/inch$^2$. In one embodiment, the ultrasonication at the first frequency is performed at a power of 45 Watt/inch$^2$. In one embodiment, the ultrasonication is performed at a power of 10 Watt/inch$^2$, a frequency of 40 kHz and a duration of 40-120 minutes. In one embodiment, the ultrasonication is performed at a power of 25 Watts/inch$^2$, a frequency of 40 kHz, and a duration of 15-40 minutes. In one embodiment, the ultrasonication is performed at a frequency of 40 kHz, a power of 45 Watt/inch$^2$ and a duration of 3 minutes. The first frequency may be less than 100 kHz. In one embodiment, the first frequency is 25-100 kHz. In another embodiment, the first frequency is 25-50 kHz. In another embodiment, the first frequency is 40 kHz.

The process 500 may alternate between different power levels for the ultrasonicating at the first frequency. For the process may apply a power of 45 Watt/inch$^2$ for 2-10 minutes and may apply a power of 15 Watt/inch$^2$ for 5-20 minutes. In one embodiment, the DI water is ultrasonicated at 45 Watt/inch$^2$ at 40 kHz for 3 minutes and is additionally ultrasonicated at 15 Watt/inch$^2$ at 40 kHz for 15 minutes.

At block 550, the DI water bath is ultrasonicated at a second frequency. The DI water may be ultrasonicated at the second frequency for a duration of about 5-120 minutes. In one embodiment, the DI water is ultrasonicated at the second frequency for a duration of 10-15 minutes. The ultrasonication may be performed at a power of 10-50 Watt/inch$^2$. In one embodiment, the ultrasonication at the first frequency is performed at a power of 25 Watt/inch$^2$. The second frequency may be more than 100 kHz. In one embodiment, the second frequency is 100 kHz-2 MHz. In another embodiment, the second frequency is 100-500 kHz. In another embodiment, the second frequency is 110-200 kHz. In another embodiment, the second frequency is 110 kHz. In another embodiment, the second frequency is 132 kHz.

The process 500 may alternate between different power levels for the ultrasonicating at the second frequency. The process may apply a power of 45 Watt/inch$^2$ for 2-15 minutes and may apply a power of 15 Watt/inch$^2$ for 2-15 minutes.

The operations of block 545 and block 550 may be performed a predetermined number (e.g., Y number) of times or cycles. In one embodiment, for process 500 the operations of block 545 and 550 are alternated for 2-5 cycles. In one embodiment, the predetermined number of cycles is 3 cycles.

At block 555, the article is dried.

The preceding description sets forth numerous specific details such as examples of specific systems, components, methods, and so forth, in order to provide a good understanding of several embodiments of the present invention. It will be apparent to one skilled in the art that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." In one embodiment, the term "about" means plus or minus ten percent.

Although the operations of the methods herein are shown and described in a particular order, the steps of each method may be altered so that certain steps may be performed in a different order, or not at all, or so that certain steps may be performed, at least in part, concurrently with other operations. In another embodiment, some steps of the method are not performed.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   immersing an article comprising a yttrium based oxide in an acidic cleaning solution comprising water, 1-10 mol % HF acid and a yttrium based salt;
   dissolving a portion of the yttrium based oxide with the HF acid;
   forming a yttrium based oxy-fluoride based on 1) a reaction between the HF acid and the dissolved portion of the yttrium based oxide and 2) a reaction between the HF acid and the yttrium based salt; and
   precipitating the yttrium based oxy-fluoride onto the article over the yttrium based oxide to form a yttrium based oxy-fluoride coating.

2. The method of claim 1, wherein the yttrium based oxy-fluoride coating has a thickness of approximately 10 nanometers to approximately 1 micron.

3. The method of claim 1, wherein the yttrium based oxide comprises $Y_2O_3$ or a ceramic compound comprising $Y_4Al_2O_9$ and a solid-solution of $Y_2O_3$—$ZrO_2$.

4. The method of claim 1, wherein the yttrium based oxy-fluoride comprises a complex mixture of $Y(OH)_3$ and $YF_3$.

5. The method of claim 4, wherein the complex mixture further comprises $H_2O$.

6. The method of claim 1, wherein the acidic cleaning solution further comprises 1-20 mol % of an additional acid, wherein the additional acid is selected from a group consisting of $HNO_3$, HCl, and $H_2SO_4$.

7. The method of claim 1, wherein the acidic cleaning solution comprises 0.1-10 mol % of the yttrium based salt.

8. The method of claim 1, further comprising:
immersing the article in deionized water after immersing the article in the acidic cleaning solution; and
alternating between ultrasonicating the article at a first frequency of less than 100 kHz for a first time period and ultrasonicating the article at a second frequency of over 100 kHz for a second time period for a predetermined number of cycles.

9. The method of claim 8, wherein the predetermined number of cycles is 1-3 cycles.

10. The method of claim 8, wherein the first frequency is 40 kHz and the second frequency is 110-200 kHz, and wherein an ultrasound power of 10-50 Watt/inch$^2$ is used for ultrasonicating the article.

11. The method of claim 1, further comprising:
immersing the article in a basic cleaning solution before or after immersing the article in the acidic cleaning solution, wherein the basic cleaning solution comprises water and at least one of 5-10 mol % $NH_4OH$ or 5-10 mol % $N(CH_3)_4{}^+OH^-$; and
alternating between immersing the article in the acidic cleaning solution and immersing the article in the basic cleaning solution for a predetermined number of cycles.

12. The method of claim 11, wherein the predetermined number of cycles is 5-10 cycles.

13. The method of claim 11, wherein the article is immersed in the acidic cleaning solution for 60 seconds to 3 minutes for each cycle and the article is immersed in the basic cleaning solution for 30-60 minutes for each cycle.

14. The method of claim 1, wherein the yttrium based fluoride is $Y_2O_3$ and the yttrium based oxy-fluoride is $YO_xF_y$, where x is 0.7-1.4 and y is 0.1-0.8.

15. The method of claim 1, wherein the acidic cleaning solution further comprises 5-10 mol % chlorine.

16. The method of claim 1, wherein the yttrium based salt comprises at least one of $Y(NO_3)_3$, $YCl_3$, or $NH_4F$.

17. The method of claim 1, wherein the acidic cleaning solution comprises 0.5-5 mol % of the yttrium based salt.

18. A method comprising:
immersing an article comprising a yttrium based oxide in an acidic cleaning solution comprising water and 1-10 mol % HF acid;
dissolving a portion of the yttrium based oxide with the HF acid;
forming a yttrium based oxy-fluoride based on a reaction between the HF acid and the dissolved portion of the yttrium based oxide; and
precipitating the yttrium based oxy-fluoride onto the article over the yttrium based oxide to form a yttrium based oxy-fluoride coating.

19. The method of claim 18, wherein the yttrium based oxy-fluoride coating comprises a complex mixture of $Y(OH)_3$ and $YF_3$ and has a thickness of approximately 10 nanometers to approximately 200 nanometers.

20. A method comprising:
immersing an article comprising a yttrium based oxide in an acidic cleaning solution comprising water, 1-10 mol % HF acid and 0.5-5 mol % of a yttrium based salt;
dissolving a portion of the yttrium based oxide with the HF acid;
forming a yttrium based oxy-fluoride based on 1) a reaction between the HF acid and the dissolved portion of the yttrium based oxide and 2) a reaction between the HF acid and the yttrium based salt; and
precipitating the yttrium based oxy-fluoride onto the article over the yttrium based oxide to form a yttrium based oxy-fluoride coating, wherein the yttrium based oxy-fluoride comprises a complex mixture of $Y(OH)_3$ and $YF_3$.

* * * * *